(12) United States Patent
Matsuura et al.

(10) Patent No.: US 7,676,334 B2
(45) Date of Patent: Mar. 9, 2010

(54) BATTERY CONDITION MONITOR (75) Inventors: Takahiro Matsuura, Yokkaichi (JP); Yoichiro Anzai, Yokkaichi (JP); Shuji Mayama, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 385 days.

(21) Appl. No.: 11/885,184

(22) PCT Filed: Mar. 3, 2006

(86) PCT No.: PCT/JP2006/304142
§ 371 (c)(1),
(2), (4) Date: Aug. 28, 2007

(87) PCT Pub. No.: WO2006/093287
PCT Pub. Date: Sep. 8, 2006

(65) Prior Publication Data
US 2008/0183408 A1 Jul. 31, 2008

(30) Foreign Application Priority Data
Mar. 4, 2005 (JP) ............... 2005-061428

(51) Int. Cl.
*G01R 31/36* (2006.01)
*G06F 17/40* (2006.01)
(52) U.S. Cl. ............... 702/63; 702/64; 702/187
(58) Field of Classification Search ............. 702/63–65, 702/187–189
See application file for complete search history.

(56) References Cited

U.S. PATENT DOCUMENTS 6,920,404 B2 * 7/2005 Yamanaka ............... 702/63

FOREIGN PATENT DOCUMENTS

| JP | A 2000-261901 | 9/2000 |
| JP | A 2002-107427 | 4/2002 |
| JP | A 2004-190604 | 7/2004 |

\* cited by examiner

*Primary Examiner*—Eliseo Ramos Feliciano
*Assistant Examiner*—Phuong Huynh
(74) *Attorney, Agent, or Firm*—Oliff & Berridge, PLC (57) ABSTRACT

An object of the present invention is to provide a battery condition monitor that is capable of reducing labor and equipment costs for parameter setting for evaluation of the battery's condition and capable of readily responding to variations due to individual differences among the same model of vehicles. The battery condition monitor according to the present invention measures a lower limit voltage value for the time when a load during engine startup is substantially connected to a brand-new battery, as an initial reference lower limit voltage value $V_{LIF}$; and derives a reference discharge characteristic of the brand-new battery with respect to the vehicle-unique load during engine startup, using the initial reference lower limit voltage value $V_{LIF}$, an initial reference no-load voltage value $V_{OIF}$ which is a no-load voltage of that battery, and information about the rate of change in the internal resistance with respect to change in the no-load voltage of the battery, the information being previously stored in a storage unit, thereby to evaluate the condition of the battery based on the reference discharge characteristic.

8 Claims, 4 Drawing Sheets

BATTERY CONDITION MONITOR

TECHNICAL FIELD

The present invention relates to a battery condition monitor for monitoring the condition of a battery (which refers to a lead battery in this description).

BACKGROUND ART

Conventionally, there have been techniques for detecting the condition of a battery (such as the degree of deterioration or the remaining amount of charge) based on a voltage-drop characteristic of the battery during discharge for example at engine startup (refer to for example Patent Document 1). This voltage-drop characteristic is closely related to a unique load for each vehicle during discharge of the battery. Thus, in the conventional techniques of this kind, various parameters for evaluation of the battery's condition are individually set for each model.

Patent Document 1: Japanese Patent Application Laid-open No. 2004-190604

However, because of the individual setting of various parameters for evaluation of the battery's condition for each model, the aforementioned conventional techniques increase labor and equipment costs for parameter setting and are difficult to respond to variations due to individual differences among the same model of vehicles.

DISCLOSURE OF THE INVENTION

Thus, the problem to be solved by the present invention is to provide a battery condition monitor and a monitoring method that are capable of reducing labor and equipment costs for parameter setting for evaluation of the battery's condition and capable of readily responding to variations due to individual differences among the same model of vehicles.

To solve the aforementioned problem, a first aspect of the present invention is directed to a battery condition monitor for storing an initial condition defined by a combination of a battery mounted on a vehicle and said vehicle and comparing the initial condition and a condition during use, using a voltage of said battery which is ever changing before startup and an approximate minimum voltage thereof during startup, thereby to monitor the remaining capacity and the state of deterioration of said battery. The battery condition monitor comprises detection means for detecting an output voltage of said battery; first storage means for storing first information indicating the relationship between change in a no-load voltage value and change in an internal resistance value for said battery being in a nearly brand-new condition; processing means for, based on said first information stored in said first storage means, based on an initial reference no-load voltage value which is a no-load voltage value detected by said detection means for said battery being in a nearly brand-new and nearly fully-charged condition, and based on an initial reference on-load voltage value which is an output voltage value detected by said detection means when said battery being in a nearly brand-new and nearly fully-charged condition is connected to a predetermined load to be discharged, deriving a reference discharge characteristic of said battery that indicates the relationship between change in said no-load voltage value and change in an on-load voltage value which is an output voltage value detected upon discharge of said predetermined load; and second storage means for storing second information including said initial reference no-load voltage value and said initial reference on-load voltage value, whereby the derivation of said reference discharge characteristic becomes possible without setting a unique parameter for said battery and for each vehicle.

According to a second aspect of the present invention, the battery condition monitor according to the first aspect is especially characterized in that, if the no-load voltage of said battery is defined as $V_{OI}$, the on-load voltage of said battery as $V_{LI}$, said initial reference no-load voltage value as $V_{OIF}$, said initial reference on-load voltage value as $V_{LIF}$, an internal resistance of said battery as $R_{BI}$, and the internal resistance value of said battery being in a nearly brand-new and nearly fully-charged condition as $R_{BIF}$, said first information is given as a function $f(V_{OI})=R_{BI}/R_{BIF}$, and said reference discharge characteristic is expressed as:

$$V_{LI}=[V_{LK}/\{(V_{OI}-V_{LK}) \cdot f(V_{OI})+V_{LK}\}] \cdot V_{OI}$$

where $V_{LK}=(V_{LIF}/V_{OIF}) \cdot V_{OI}$

A third aspect of the present invention is directed to the battery condition monitor according to the first or second aspect, which is characterized in that said processing means derives the degree of deterioration of said battery and the remaining amount of charge therein based on said reference discharge characteristic, based on an used no-load voltage value which is a no-load voltage value detected by said detection means for said battery which has started to be used, and based on an used on-load voltage value which is an output voltage value detected by said detection means when said battery which has started to be used is connected to said predetermined load to be discharged.

A fourth aspect of the present invention is directed to the battery condition monitor according to the third aspect, which is characterized in that said processing means determines said degree of deterioration based on a difference between said initial reference no-load voltage value and a corresponding no-load voltage value which is a no-load voltage value corresponding to said used on-load voltage value in said reference discharge characteristic, and based on a difference between said initial reference no-load voltage value and said used on-load voltage value.

A fifth aspect of the present invention is directed to the battery condition monitor according to the third aspect, which is characterized in that said processing means determines a first ratio of a difference between said initial reference no-load voltage value and said used on-load voltage value to a difference between said initial reference no-load voltage value and a corresponding no-load voltage value which is a no-load voltage value corresponding to said used on-load voltage value in said reference discharge characteristic; and a minimum used no-load voltage value which is a no-load voltage value for the time when the remaining amount of charge in said battery which has started to be used is approximately zero, so that said first ratio becomes equal to a second ratio of a difference between said initial reference no-load voltage value and said minimum used no-load voltage value to a difference between said initial reference no-load voltage value and a minimum reference no-load voltage value which is a no-load voltage value for the time when the remaining amount of charge in said battery in a nearly brand-new condition is approximately zero, thereby to determine said remaining amount of charge based on the difference between said initial reference no-load voltage value and said minimum used no-load voltage value and based on a difference between said used no-load voltage value and said minimum used no-load voltage value.

According to the first and second aspects of the present invention, the way of change in the internal resistance value of a nearly brand-new battery with changes in the no-load voltage value in response to changes in the remaining amount of charge in the battery is almost common to batteries of different grades or the like. Accordingly, based on the first information indicating the way of change in the internal resistance value with changes in the no-load voltage value, based on the initial reference on-load voltage value of the battery being in a nearly brand-new condition, and based on the initial reference on-load voltage value with respect to a predetermined load (which may be unique for each vehicle), the reference discharge characteristic that indicates the way of change in the on-load voltage value with changes in the no-load voltage value of the battery being in a nearly brand-new condition which is used as a criterion for evaluating the battery's condition, can automatically be obtained without setting a unique parameter for each battery and for each vehicle. This consequently reduces labor and equipment costs for parameter setting and makes it easy to respond to variations due to individual differences among the same model of vehicle.

A predetermined load connected to the battery in detecting the initial reference on-load voltage value may be a unique load for each vehicle. Using a unique load for each vehicle as a predetermined load makes it possible to automatically obtain a battery evaluation criterion that is unique for each vehicle and that reflects a unique discharge characteristic obtained when the vehicle-unique load is connected to the battery.

According to the third aspect of the present invention, the processing means derives the degree of deterioration of the battery and the remaining amount of charge therein based on the reference discharge characteristic, based on the used no-load voltage value, and based on the used on-load voltage value. This eliminates the need to set a unique parameter for each battery and for each vehicle for derivation of the degree of deterioration and the remaining amount of charge.

According to the fourth aspect of the present invention, the processing means determines the degree of deterioration of a battery based on the difference between the initial reference no-load voltage value and the corresponding no-load voltage value and based on the difference between the initial reference no-load voltage value and the used on-load voltage value. Thus, only a simple computation is necessary to determine the degree of deterioration of the battery.

Besides, the degree of deterioration of the battery at each point in time can be determined without depending on the remaining amount of charge in the battery.

According to the fifth aspect of the present invention, the processing means determines the remaining amount of charge in a battery based on the difference between the initial reference no-load voltage value and the minimum used no-load voltage value and based on the difference between the used no-load voltage value and the minimum used no-load voltage value. Thus, only a simple computation is necessary to determine the remaining amount of charge in the battery.

Besides, the remaining amount of charge in the battery at each point in time can be determined without depending on the degree of deterioration of the battery.

These and other objects, features, aspects and advantages of the present invention will become more apparent from the following detailed description of the present invention when taken in conjunction with the accompanying drawings.

BEST MODE FOR CARRYING OUT THE INVENTION

<Description of Principle>

In advance of a concrete description of a battery condition monitor according to one preferred embodiment of the present invention, the principle of evaluation of the battery's condition according to the preferred embodiment of the present invention will be described.

Figure 1:
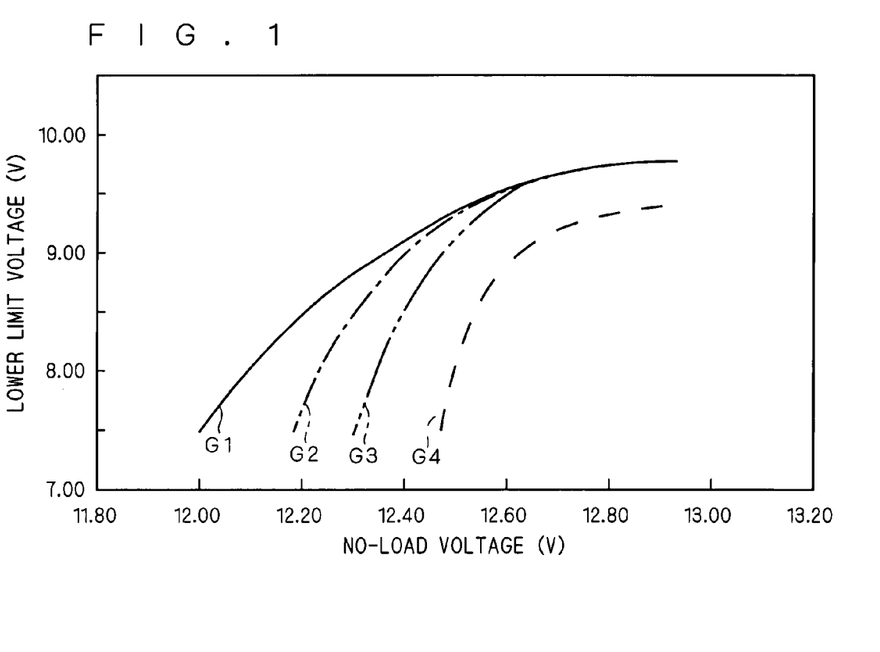
[FIG. 1] a graph showing the measurement result that gives no-load voltage and lower limit voltage during engine startup, both of which have been measured through test, for batteries with different conditions of deterioration and different remaining amounts of charge.

FIG. 1 is a graph showing the measurement result that gives no-load voltage (which is the output voltage for the time when a battery is practically not discharged) and lower limit voltage during engine startup (which is the minimum value of the output voltage of a battery when the output voltage decreases due to discharge during engine startup, and which corresponds to an on-load voltage according to the present invention), both of which have been measured by test, for batteries with different conditions of deterioration and different remaining amounts of charge. The horizontal axis corresponds to the no-load voltage value of batteries during engine startup and before the start of discharge in each discharge test; and the vertical axis corresponds to the lower limit voltage value of the batteries during engine startup and during discharge in each discharge test. The curve G1 in FIG. 1 depicts the result of measurement for a brand-new battery (which should only practically be brand-new (the same is applied hereinafter)); and the curves G2, G3 and G4 depict the results of measurement for batteries which have been somewhat deteriorated with use. The batteries shown in the curves G2, G3, and G4 have been used longer and thus more deteriorated in this order. Use of the no-load voltage value obtained after a lapse of a predetermined time period from the completion of charging (from engine stop) further improves accuracy in acquisition of the discharge characteristic of a battery 1, in evaluation of the condition of the battery 1, or the like. The graph of FIG. 1 indicates that, as the deterioration of the battery proceeds, the corresponding curves G1 to G4 are shifted roughly toward the right (or toward the lower right) of the graph. Especially, it can be seen that, in the area where the lower limit voltage value is at or below a predetermined reference level (e.g., 9 V), the amounts of shifts of the curves G2 to G4 toward the right with reference to the curve G1 tend to increase with the progress of deterioration of the corresponding batteries. This indicates that deriving the discharge characteristic (the lower limit voltage value during engine startup and during discharge for each on-load voltage value responsive to each remaining amount of charge) of a brand-new battery during engine startup, which corresponds to the curve G1, makes a criterion for evaluation of the battery's condition.

However, the condition of a load connected to a battery during engine startup varies widely from model to model. Thus, if conventional techniques are applied for obtaining the discharge characteristic of a battery during engine startup, which corresponds to the curve G1, the discharge characteristic of the battery during engine startup, which corresponds to the curve G1, is detected by test under certain reference conditions and then is subjected to fine control using control parameters defined for each model.

The inventors of the present invention have focused on that challenge involved in the conventional techniques and have accomplished the present invention in which the discharge characteristic or the like of a battery during engine startup, which reflects a vehicle-unique load condition during engine startup, can automatically be acquired without using vehicle-unique control parameters. The principle of the present invention is as follows.

Figure 2:
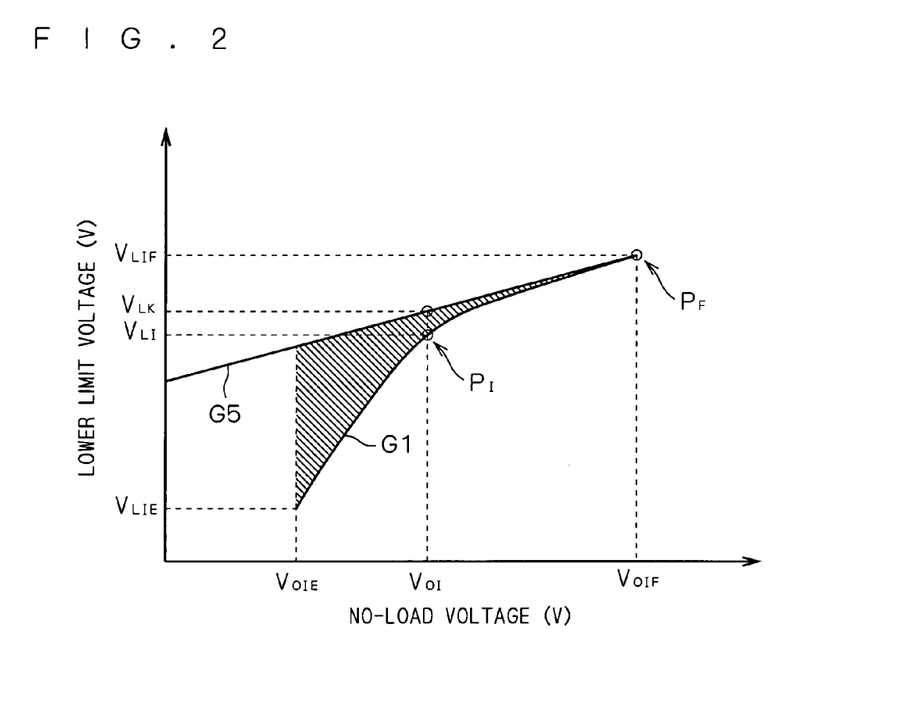
[FIG. 2] a graph for explaining a discharge characteristic of a battery during engine startup.
Figure 3:
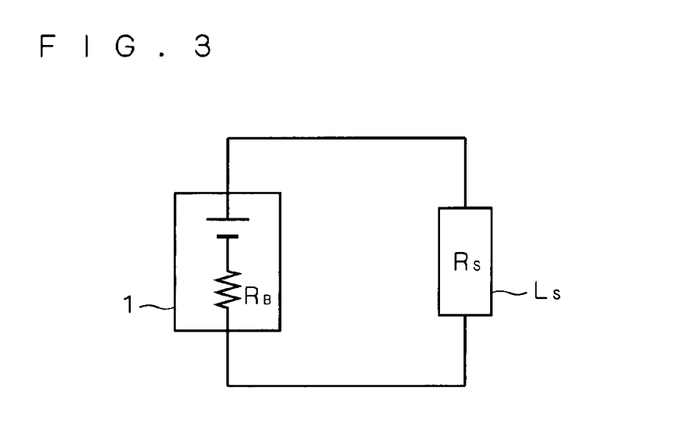
[FIG. 3] a circuit diagram schematically showing the relationship between a load connected to a battery during engine startup and an internal resistance of the battery.

FIG. 2 is a graph for explaining the discharge characteristic of a battery during engine startup. The curve G1 in the graph of FIG. 2 corresponds to the curve G1 in FIG. 1. As shown in FIG. 3, if the resistance value of a during-engine-startup load $L_S$ (a load other than the internal resistance of the battery and including a starter, other resistance elements, or the like) which is connected to the battery 1 during engine startup is defined as $R_S$, the internal resistance value of the battery 1 as $R_B$, the no-load voltage value of the battery 1 as $V_O$, and the lower limit voltage value which is the minimum value of the output voltage for the time when the battery 1 is connected to the during-engine-startup load $L_S$ to be discharged as $V_L$, the following relation holds among these parameters $R_S$, $R_B$, $V_O$, and $V_L$:

[Equation 1]

$$\frac{R_s}{R_B} = \frac{V_L}{V_O - V_L} \quad (1)$$

To solve this equation (1) for $V_L$, the following expression is derived.

[Equation 2]

$$V_L = \frac{R_S}{R_S + R_B} V_O \quad (2)$$

Assuming that, in this equation (2), the internal resistance value $R_B$ remains unchanged irrespective of the no-load voltage value $V_O$ (i.e., the remaining amount of charge in the battery 1), the resistance value $R_S$ of the during-engine-startup load $L_S$ is constant irrespective of the no-load voltage value $V_O$. Thus, an expression is obtained which corresponds to a straight line G5 passing through the origin point of the coordinate system in the graph of FIG. 2 (the expression representing a proportional relationship between the values $V_O$ and $V_L$).

In practice, since the internal resistance value $R_B$ in equation (2) increases with a decrease in the no-load voltage value $V_O$ (the remaining amount of charge in the battery 1), the proportion of decrease in the lower limit voltage value $V_L$ increases with a decrease in the no-load voltage value $V_O$ as shown by the curve G1. That is, it can be said that, in the graph of FIG. 2, a gradual increase in the amount of alienation of the curve G1 from the straight line G5 in the negative direction along the vertical axis with a decrease in the no-load voltage value $V_O$ is due to an increase in the internal resistance value $R_B$ with a decrease in the no-load voltage value $V_O$.

The inventors of the present invention have focused on the characteristic that the proportion of increase in the internal resistance value $R_B$ of the battery 1 with a decrease in the no-load voltage value $V_O$ (the remaining amount of charge in the battery 1) is almost common to every brand-new battery 1, and have reached a conclusion that effective use of that characteristic enables easy detection of a vehicle-unique discharge characteristic of a brand-new battery 1 with respect to the during-engine-startup load $L_S$.

Specifically, information about the proportion of increase in the internal resistance value $R_B$ with a decrease in the no-load voltage value $V_O$ for a brand-new battery 1 is previously obtained and stored in a system; and when the battery 1 is in a brand-new condition such as at completion of vehicle assembly in the factory, at shipment, at the time of vehicle delivery to end user, or within a predetermined time period after delivery to end user, the discharge characteristic of the battery 1 (the no-load voltage value $V_O$ of the brand-new battery 1 with a reference amount of charge and the lower limit voltage value $V_L$ thereof when connected to the during-engine-startup load $L_S$) with respect to the during-engine-startup load $L_S$ is measured to obtain a single vehicle-unique measurement point on the graph of FIG. 2; and then, based on the measurement point and the previously stored information about the proportion of increase in the internal resistance value $R_B$, the vehicle-unique discharge characteristic of the brand-new battery 1 with respect to the during-engine-startup load $L_S$ can be obtained. The aforementioned vehicle-unique measurement point may be obtained through numerical processing such as averaging (including weighted averaging) of measurement results obtained by a plurality of measurements. In that case, there is considered such a method as to preferentially utilize the measurement point corresponding to the maximum no-load voltage according to the no-load voltage value (the remaining amount of charge) of the battery 1 at measurement, or to increase the degree of contribution of the weighted averaging.

More specifically, as a first step, a test is conducted to measure a no-load voltage value $V_{OIF}$ and an internal resistance value $R_{BIF}$ for the time when the brand-new battery 1 is in a fully charged state (the battery 1 needs only be in a substantially fully charged sate (the same is applied hereinafter)), and the rate of change ($R_{BI}/R_{BIF}$) in the internal resistance value $R_{BI}$ for each no-load voltage value $V_{OI}$ with respect to the internal resistance value $R_{BIF}$ when the remaining amount of charge decreases. Then, the rate of change ($R_{BI}/R_{BIF}$) in the internal resistance value $R_{BI}$ with changes in the no-load voltage value $V_{OI}$ of the brand-new battery 1 is approximately obtained as a function (for example, such a function as given by equation (3)) that takes the no-load voltage value $V_{OI}$ as a variable, and information about that function is previously stored in the system. As an alternative thereto, a data table containing each no-load voltage value $V_{OI}$ and a corresponding rate of change ($R_{BI}/R_{BIF}$) in the internal resistance value $R_{BI}$ may previously be stored in the system. A concrete method of measuring the rate of change ($R_{BI}/R_{BIF}$) in the internal resistance value $R_{BI}$ for each no-load voltage value $V_{OI}$ will be described later.

[Equation 3]

$$\frac{R_{BI}}{R_{BIF}} = f(V_{OI}) \quad (3)$$

Then, when the battery 1 is in a brand-new condition such as at completion of vehicle assembly in the factory and in a fully charged state, measurements are made to obtain a no-load voltage value (initial reference on-load voltage value) $V_{OIF}$ and a lower limit voltage value (initial reference lower limit voltage value) $V_{LIF}$ of the battery 1 when connected to the during-engine-startup load $L_S$. Whether or not the battery 1 is in a fully charged state is determined for example by measuring the no-load voltage value of the battery 1 and determining whether the measured value is at or above a predetermined reference level corresponding to the fully charged state. As described above, a plurality of measurements of the initial reference on-load voltage value $V_{OIF}$ and the initial reference lower limit voltage value $V_{LIF}$ may be made in order to utilize the average of those measured values.

Using the results of measurements of the initial reference on-load voltage value $V_{OIF}$ and the initial reference lower limit voltage value $V_{LIF}$ and using the function given by the above equation (3) (or a data table equivalent thereto), a relational expression representing change in the lower limit voltage value $V_{LI}$ with changes in the no-load voltage value $V_{OI}$ with respect to the during-engine-startup load $L_S$ of the vehicle-mounted brand-new battery 1 is given by the following equation:

[Equation 4]

$$V_{LI} = \frac{V_{LK}}{(V_{OI} - V_{LK}) \cdot f(V_{OI}) + V_{LK}} \cdot V_{OI} \quad (4)$$

The parameter $V_{LK}$ in the above equation (4) is the lower voltage value for the no-load voltage value of $V_{OI}$ on the straight line G5 in the graph of FIG. 2 and is given by the following equation (5).

[Equation 5]

$$V_{LK} = \frac{V_{LIF}}{V_{OIF}} \cdot V_{OI} \quad (5)$$

The relational expression given by equation (4) is derived for example as follows. Specifically, when the relation given by the above equation (1) is considered to be applied to a coordinate $P_F$ in the graph of FIG. 2 and if the internal resistance value $R_B$ for the no-load voltage value $V_{OIF}$ (in a fully charged state) is defined as $R_{BIF}$, the following relational expression (6) is obtained.

[Equation 6]

$$\frac{R_{BI}}{R_{BIF}} = \frac{V_{LIF}}{V_{OIF} - V_{LIF}} \quad (6)$$

And when the relation given by the above equation (1) is considered to be applied to a coordinate $P_1$ in the graph of FIG. 2, the internal resistance value $R_B$ for the no-load voltage value $V_{OI}$ can be derived as $R_B = f(V_{OI}) \cdot R_{BIF}$ from the above equation (3), from which the following relational expression (7) is obtained.

[Equation 7]

$$\frac{R_S}{f(V_{OI}) \cdot R_{BIF}} = \frac{V_{LI}}{V_{OI} - V_{LI}} \quad (7)$$

Substituting the right side of the relational expression (6) into the parameter ($R_S/R_{BIF}$) in the left side of the relational expression (7) and solving for the parameter $V_{LI}$ yield the above relational expression (4).

The relational expression given by the above equation (6), when viewed from a different point of view, derives the lower limit voltage value $V_{LI}$ for each remaining amount of charge (each no-load voltage value $V_{OI}$) by, with reference to the straight line G5 in the graph of FIG. 2, shifting a point on the straight line G5 in the negative direction along the vertical axis by the amount of shift corresponding to the way of change in the rate of change in the internal resistance value of the battery 1 responsive to the no-load voltage value $V_{OI}$ at that point, the rate of change being given by the relation in the above equation (3).

Information about the relationship between such derived no-load voltage value $V_{OI}$ and lower limit voltage value $V_{LI}$ reflects the resistance value $R_S$ of the during-engine-startup load $L_S$ which is unique for each vehicle. Thus, using this information allows the evaluation of the condition of the battery 1 that reflects a vehicle-unique load environment or the like.

The values $V_{OIE}$ and $V_{LIE}$ in the graph of FIG. 2 correspond respectively to the no-load voltage value and the lower limit voltage value for the time when the remaining amount of charge in the brand-new battery 1 is zero (the remaining amount of charge needs only be substantially zero (the same is applied hereinafter)). In one specific example, the values $V_{OIF}$ and $V_{OIE}$ are for example 12.8 V and 10.5V, respectively.

Next described is a method of obtaining information about the proportion of increase in the internal resistance value $R_B$ with a decrease in the no-load voltage value $V_O$ of a brand-new battery 1. First, in the preferred embodiment of the present invention, a capacity test is conducted on a brand-new battery 1 according to the JIS standards for battery capacity tests. The capacity test conforming to the JIS standards herein refers to a test in which the battery 1 in a fully charged state is discharged at a constant current value (e.g., 0.2 A) to measure the time required for the output voltage of the battery 1 at the start of discharge to reach a voltage value (e.g., 10.5 V) which corresponds to the case where the remaining amount of charge is zero, and then to multiply the time required and the discharge current value (e.g., 0.2 A) to obtain the battery capacity. As an alternative, the discharge characteristic other than the conditions (such as current value and temperature) for the JIS-compliant discharge test may be utilized.

Figure 4:
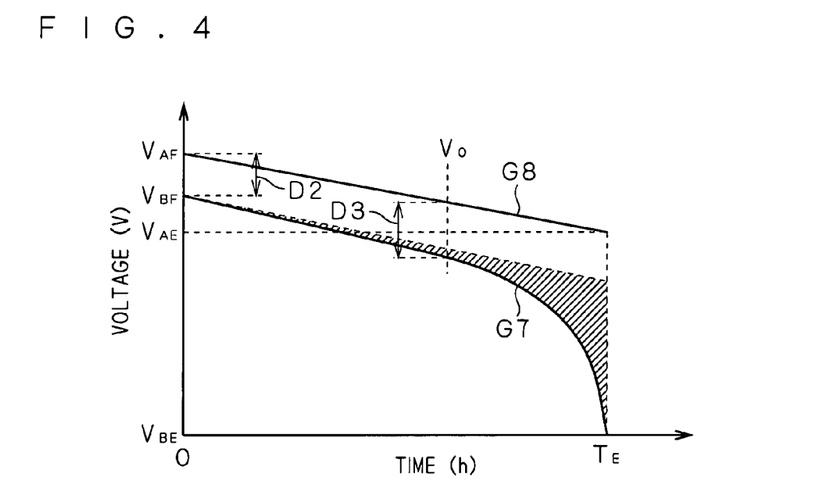
[FIG. 4] a graph showing the transition of the output voltage of a brand-new battery during discharge, which is measured using a JIS-compliant capacity test.

Specifically, according to the preferred embodiment of the present invention, while a brand-new battery 1 in a fully charged state is discharged at a constant current value (e.g., 0.2 A) which is in compliance with the JIS standards, the transition of the output voltage of the battery 1 at that time is measured. The curve G7 in the graph of FIG. 4 shows the measurement result of the transition of the output voltage at that time. The value $V_{AF}$ in the graph is the output voltage value (no-load voltage value) of the battery 1 in a fully charged state before the start of discharge, and corresponds to the aforementioned value $V_{OIF}$. The value $V_{AE}$ is the no-load voltage value at the completion of discharge at which time the remaining amount of charge in the battery 1 is zero, and corresponds to the aforementioned value $V_{OIE}$. The value $V_{BF}$ is the output voltage value of the battery 1 immediately after the start of discharge. The value $V_{BE}$ is the output voltage value at the completion of discharge at which time the remaining amount of charge in the battery 1 is zero. The value $T_E$ indicates the time at the completion of discharge, at which time the remaining amount of charge is zero. The straight line G8 is what the transition of change in the measured value of the no-load voltage of the battery 1 with a decrease in the remaining amount of charge due to discharge is approximated by a straight line. The hatched area in this graph represents the area that reflects the influence of increase in the internal resistance value $R_B$ of the battery 1 with a decrease in the remaining amount of charge, the area corresponding to the hatched area in FIG. 2 and in the graph of FIG. 5 which will be described later.

Figure 5:
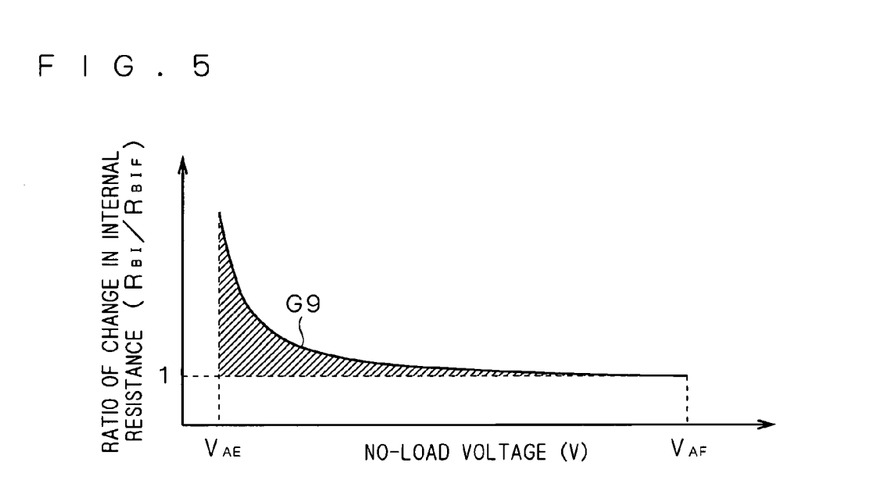
[FIG. 5] a graph showing the transition of the rate of change in the internal resistance with changes in the no-load voltage upon discharge.

The magnitude of a difference between a point on the curve G7 and a point on the curve G8 along the vertical axis in the graph of FIG. 4 is proportional to the internal resistance value $R_B$ of the battery 1 at that point in time. Accordingly, the rate of change $(R_B/R_{BF})$ in the internal resistance value $R_B$ for each no-load voltage value $V_O$ can be derived from the ratio (D3/D2) of a difference D2 between the values $V_{AF}$ and $V_{BF}$ at the start of discharge (in a fully charged state) and a difference D3 between each point on the curve G8 and each point on the curve G7 during the process of discharge. The curve G9 in the graph of FIG. 5 shows such derived rate of change $(R_B/R_{BF})$ in the internal resistance value $R_B$ with changes in the no-load voltage value $V_O$. Based on this curve G9, the aforementioned equation (3) is determined.

The rate of change $(R_B/R_{BF})$ in the internal resistance value $R_B$ with changes in the no-load voltage value $V_O$ obtained in this way does not depend much on variations of the battery 1 such as grades, but in order to improve applicability to various batteries 1, it is desirable to utilize an average of the ratios of change $(R_B/R_{BF})$ in the internal resistance value $R_B$ obtained by tests on various batteries 1.

Figure 6:
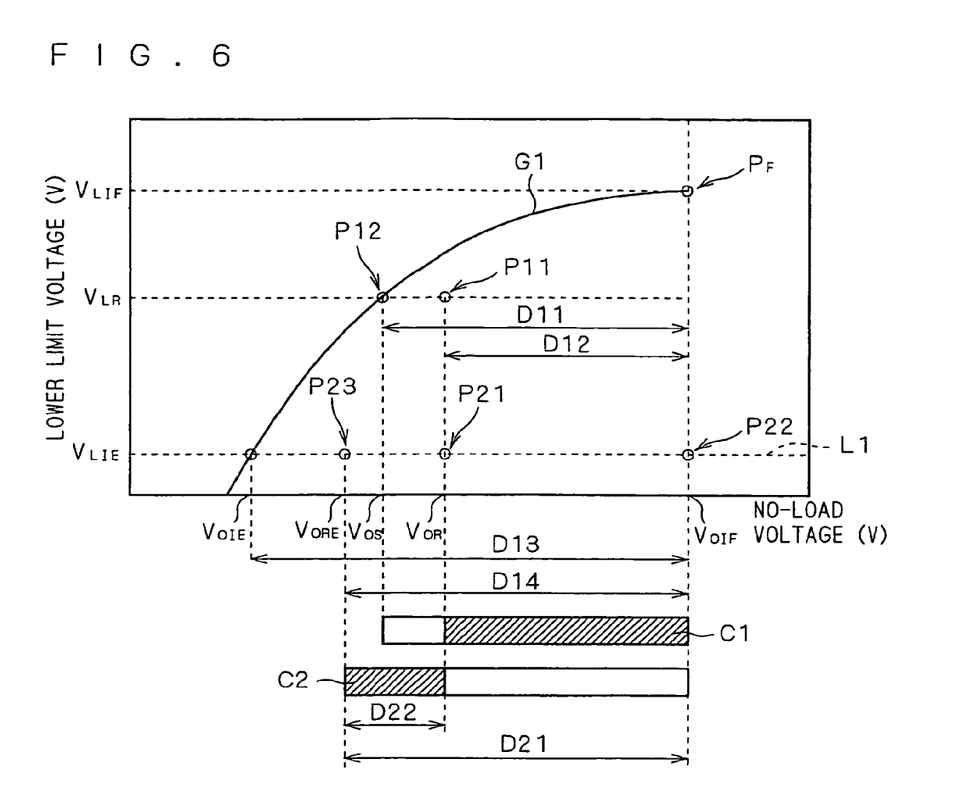
[FIG. 6] a graph for explaining the principle of evaluation of the battery's condition based on the derived discharge characteristic of the battery during engine startup.

Referring next to FIG. 6, the principle of evaluation of the condition (the degree of deterioration and the remaining amount of charge) of the battery 1 using the relational expressions given by the above equations (4) and (5) (or a data table that is equivalent to the relational expressions and that associates the no-load voltage value $V_{OI}$ with the lower limit voltage value $V_{LI}$) will be described.

First, the principle of evaluation of the degree of deterioration will be described. The curve G1 in the graph of FIG. 6, as described above, is derived using the relational expressions given by the above equations (4) and (5) (or a data table that is equivalent to the relational expressions and that associates the no-load voltage value $V_{OI}$ with the lower limit voltage value $V_{LI}$) which are previously stored in the system, and using the aforementioned initial reference no-load voltage value $V_{OIF}$ and the aforementioned initial reference lower limit voltage value $V_{LIF}$. This information about the curve G1 in FIG. 6 and the values $V_{OIF}$ and $V_{LIF}$ is stored in the system for use in the evaluation of the condition of the battery 1.

To evaluate the degree of deterioration of the battery 1 with the battery 1 having started to be used, measurements are made to determine an used no-load voltage value $V_{OR}$ which is a no-load voltage before the during-engine-startup load $L_S$ during engine startup is connected to the battery 1, and an used lower limit voltage value $V_{LR}$ which is a lower limit voltage for the time when the during-engine-startup load $L_S$ is connected to the battery 1. At this time, the battery 1 needs not to be in a fully charged state.

Then, a no-load voltage value for which corresponding lower limit voltage value on the curve G1 in the graph of FIG. 6 is equal to the used lower limit voltage value $V_{LR}$ is derived as a corresponding reference no-load voltage value $V_{OS}$, and a comparison is made between a first differential value D11 which is a difference between the previously stored initial reference no-load voltage value $V_{OIF}$ and its corresponding reference no-load voltage value $V_{OS}$ and a second differential value D12 which is a difference between the initial reference no-load voltage value $V_{OIF}$ and the used no-load voltage value $V_{OR}$. This results in detection of the degree of deterioration of the battery 1 at that point in time.

This principle of detection takes advantage of the characteristic, which has previously been described with reference to FIG. 1, that the smaller the degree of deterioration of the battery 1, the closer to the curve G1 the measurement point $(V_O, V_L)$ on the graph is shifted roughly toward the left. That is, as the degree of deterioration of the battery 1 decreases, a measurement point P11 $(V_{OR}, V_{LR})$ on the graph of FIG. 6 becomes closer to a coordinate P12 on the corresponding curve G1. And the degree of deterioration of the battery 1 is evaluated based on the extent to which the measurement point P11 is close to the coordinate P12.

Next, the principle of evaluation of the remaining amount of charge will be described. The evaluation of the remaining amount of charge, as is the case for the evaluation of the degree of deterioration, is also made utilizing the relationship between the on-load voltage and the lower limit voltage for the brand-new battery 1 which are shown by the curve G1 in the graph of FIG. 6. For the evaluation of the remaining amount of charge, the used no-load voltage value $V_{OR}$ and the used lower limit voltage $V_{LR}$ are measured. It is noted that the minimum reference no-load voltage value $V_{OIE}$, which is a no-load voltage for the time when the remaining amount of charge in the brand-new battery 1 is zero and which is obtained along with the rate of change in the internal resistance given by the above equation (3), is previously stored in a storage unit 17 as initial settings.

As is the case for the evaluation of the degree of deterioration, the no-load voltage value for which corresponding lower limit voltage value on the curve G1 in the graph of FIG. 6 is equal to the used lower limit voltage value $V_{LR}$ is derived as the corresponding reference no-load voltage value $V_{OS}$. Then, the minimum used no-load voltage value $V_{ORE}$, which is a no-load voltage obtained on the assumption that the remaining amount of charge in the battery 1 for that time, where the battery 1 has started to be used, would be zero, is derived as follows. Specifically, the ratio between a value D13 obtained by subtracting the minimum reference no-load voltage value $V_{OIE}$ from the previously determined initial reference no-load voltage value $V_{OIF}$ and a value D14 obtained by subtracting the minimum used no-load voltage value $V_{ORE}$ from the initial reference no-load voltage value $V_{OIF}$ is made equal to the ratio between a value D11 obtained by subtracting the corresponding reference no-load voltage value $V_{OS}$ from the initial reference no-load voltage value $V_{OIF}$ and a value D12 obtained by subtracting the used no-load voltage value $V_{OR}$ from the initial reference no-load voltage value $V_{OIF}$, thereby to derive the minimum used no-load voltage value $V_{ORE}$.

Then, a third differential value D21 which is a difference between the initial reference no-load voltage value $V_{OIF}$ and the minimum used no-load voltage value $V_{ORE}$ and a fourth differential value D22 which is a difference between the used no-load voltage value $V_{OR}$ and the minimum used no-load voltage value $V_{ORE}$ are compared to detect the remaining amount of charge in the battery 1 at that point in time.

This principle of detection takes advantage of the characteristic that, with a decrease in the remaining amount of charge in the battery 1 from a fully charged state, a coordinate P21 on a virtual line L1 parallel to the horizontal axis in the graph of FIG. 6, the coordinate P21 corresponding to the measurement point P11, becomes closer to a coordinate P23 which corresponds to the case where the remaining amount of charge is zero, away from a coordinate P22 which corresponds to the case where the remaining amount of charge is full.

<Device Configuration>

Figure 7:
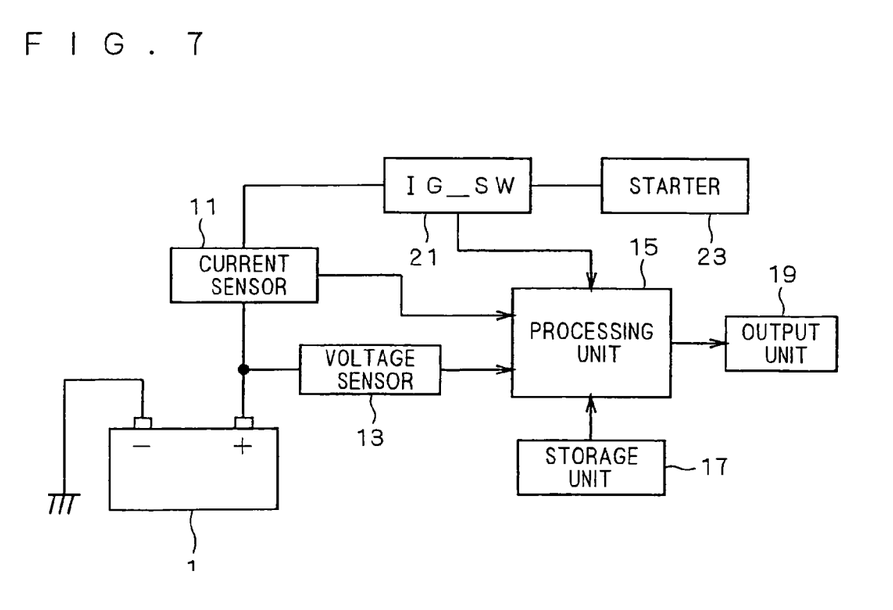
[FIG. 7] a block diagram of a battery condition monitor according to one preferred embodiment of the present invention.

FIG. 7 is a block diagram of a battery condition monitor according to one preferred embodiment of the present invention. This battery condition monitor, as shown in FIG. 7, comprises a current sensor 11, a voltage sensor (voltage detection means) 13, a processing unit 15, a storage unit 17, and an output unit 19 and is for monitoring the condition of a battery 1 mounted on a vehicle. The processing unit 15 corresponds to measurement control means and first to third information processing means according to the present invention, and the storage unit 17 corresponds to first and second storage means according to the present invention.

The current sensor 11 detects the amount of current input and output to and from the battery 1. The voltage sensor 13 detects the output voltage of the battery 1. The processing unit 15 is configured with a CPU and the like, and performs various information processing operations (including control operations) for monitoring of the battery 1. The storage unit 17 is configured with memory and the like, and stores information or the like necessary for various information processing operations performed by the processing unit 15. The output unit 19 is for outputting the result of determination of the condition of the battery 1 or the like.

<Overall Predetermined Operation>

Figure 8:
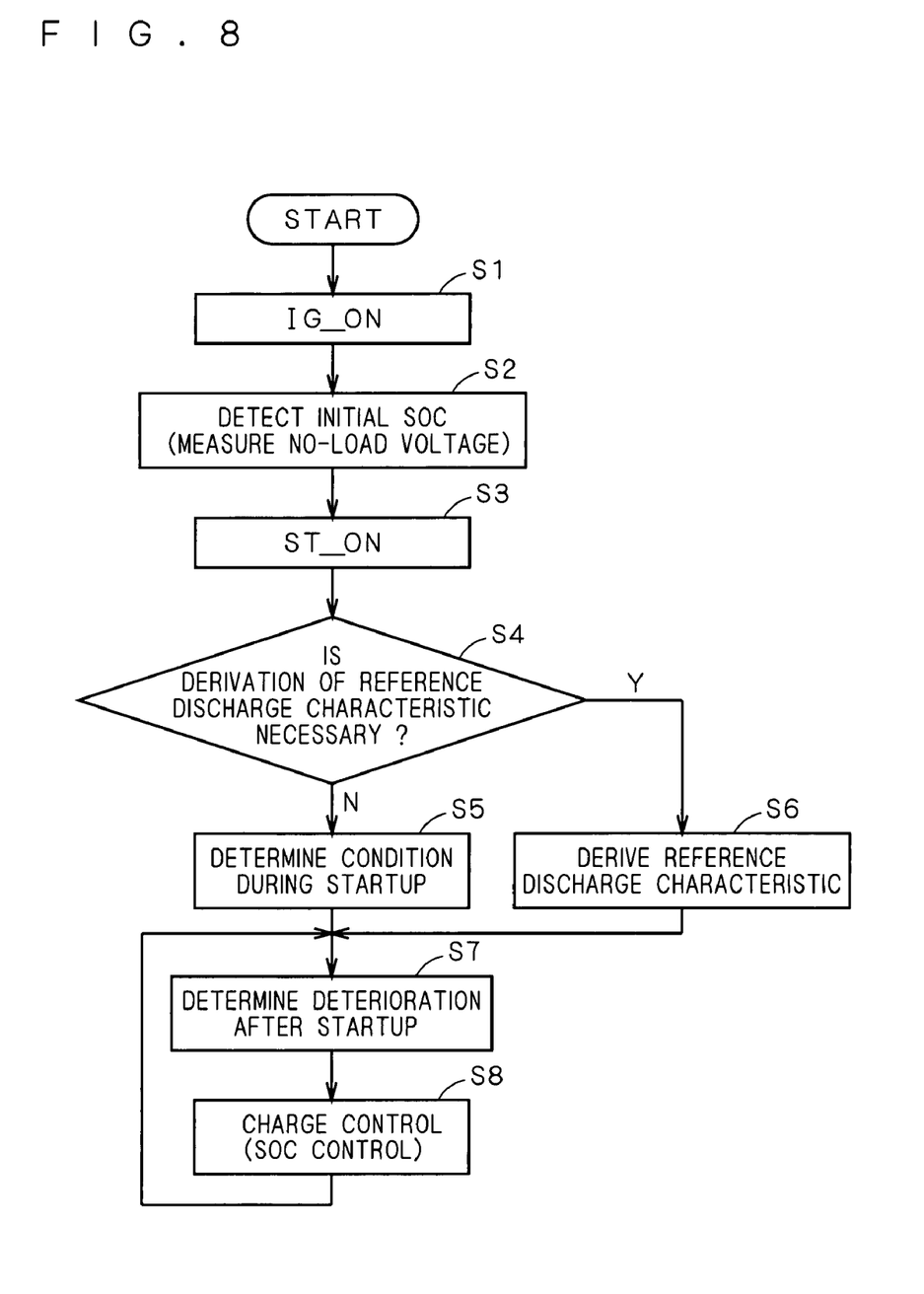
[FIG. 8] a flowchart showing the overall processing operation of the battery condition monitor in FIG. 7.

Now, an overall processing operation of this battery condition monitor will be described with reference to FIG. 8. Upon turning an ignition switch (hereinafter referred to as an "IG switch") 21 ON in step S1, the processing unit 15 performs a detection operation of detecting the initial remaining amount of charge in step S2. This detection operation is to measure a no-load voltage of the battery 1 via the current sensor 13 and to detect, based on the measured value of the no-load voltage, the remaining amount of charge (the initial remaining amount of charge) in the battery 1 before engine startup. At this time, whether the battery 1 is in a fully charged state or not is also determined. The no-load voltage of the battery 1 measured herein is utilized for during-engine-startup condition determination processing in step S5 or reference-discharge-characteristic derivation processing in step S6, which will be described later.

Upon drive of a starter 23 to start up the engine not shown in the subsequent step S3, the processing unit 15 determines in step S4 whether or not the processing for deriving the reference discharge characteristic of the battery 1 is necessary. Specifically, if the processing for deriving the reference discharge characteristic has not yet been performed after completion of vehicle assembly, the process goes to step S6, where the reference-discharge-characteristic derivation processing is performed. If the derivation processing has already been completed, the process goes to step S5, where the during-engine-startup condition determination processing is performed. The determination of whether the derivation of the reference discharge characteristic has already been completed or not is made for example by determining whether or not the relational expressions given by the above equations (4) and (5) (or a data table equivalent thereto) are stored in the storage unit 17. The derivation of the reference discharge characteristic is substantially required only once at the completion of vehicle assembly or the like until the next exchange of the battery 1. After the reference-discharge-characteristic derivation processing in step S6 or the during-engine-startup condition determination processing in step S5, the process goes to step S7, where after-startup deterioration determination processing is performed. Specifics of the reference-discharge-characteristic derivation processing and the during-engine-startup condition determination processing will be described later.

The processing unit 15 then performs the after-engine-startup deterioration determination operation in the subsequent step S7. This after-startup deterioration determination operation is to detect via the current sensor 11 the condition of current flow into the battery 1 which has been fully charged (or nearly fully charged) by charging after engine startup and to determine the degree of deterioration of the battery 1 based on the condition of the current inflow.

The processing unit 15 also exercises charge control over the battery 1 (monitoring of the remaining amount of charge in the battery 1) in the subsequent step S8. This charge control is to sequentially detect the whole amount of current discharged from the battery 1 since a predetermined reference point in time such as at engine startup by adding up the measured current values of the current sensor 11, and to determine the amount of charge supplied to the battery 1 based on the result of detection. This keeps the remaining amount of charge in the battery 1 during runs within a predetermined range. The control over the amount of charge is exercised for example by controlling the amount of power generation (such as output voltage) by an alternator not shown.

The after-engine-startup deterioration determination operation and the charge control in steps S7 and S8 continue to be repeated until engine shutdown.

<Reference-Discharge-Characteristic Derivation Processing>

Now, the aforementioned reference-discharge-characteristic derivation processing performed in step S6 shown in FIG. 8 will be described. This reference-discharge-characteristic derivation processing is based on the premise that the storage unit 17 needs to store information about such a function as given by the above equation (3) which approximately expresses the rate of change $(R_{BI}/R_{BIF})$ in the internal resistance value $R_{BI}$ with respect to changes in the no-load voltage value $V_{OI}$ of the brand-new battery 1, using the no-load voltage value $V_{OI}$ as a variable (or information about a data table equivalent thereto which associates the no-load voltage value $V_{OI}$ with the rate of change $(R_{BI}/R_{BIF})$ in the internal resistance value $R_{BI}$ for each no-load voltage value $V_{OI}$).

The processing unit 15 performs this reference-discharge-characteristic derivation processing only when the battery 1 is in a fully charged state, according to the detection in step S2. If the battery 1 is not in a fully charged state, the process goes for example to step S7 without performing the derivation processing. Then, if the battery 1 becomes fully charged at the next engine startup, at that time the reference-discharge-characteristic derivation processing is performed in step S6.

In this derivation processing, as described above, the lower limit voltage value for the time when the during-engine-startup load $L_S$ is connected to the battery 1 is measured via the voltage sensor 13 as the initial reference lower limit voltage value $V_{LIF}$, and then the reference discharge characteristic of the brand-new battery 1 with respect to the duringengine-startup load $L_S$ which is unique for each vehicle is derived using this initial reference lower limit voltage value $V_{LIF}$; the initial reference no-load voltage value $V_{OIF}$ which is the no-load voltage measured in the next previous step S2; and the above equation (3) (or a data table equivalent to the above equation (3)). That is, the reference discharge characteristic of the brand-new battery 1 is derived as the relational expression given by the above equation (4) that expresses change in the lower limit voltage value $V_{LI}$ with change in the no-load voltage value $V_{OI}$. The parameter $R_{LK}$ in equation (4) is obtained from the above equation (5).

While in this preferred embodiment such derived relationship between change in the no-load voltage value $V_{OI}$ and change in the lower limit voltage value $V_{L1}$ for the brand-new battery 1 is stored in the storage unit 17 in the form of the relational expressions (4) and (5), it may be stored in the form of a data table (coordinate information representing the curve G1 in the two-dimensional coordinates where the vertical axis represents the no-load voltage and the horizontal axis represents the lower limit voltage) that is substantially equivalent to the relational expressions (4) and (5) in the storage unit 17.

In this reference-discharge-characteristic derivation processing, the initial reference no-load voltage value $V_{OIF}$ and the initial reference lower limit voltage value $V_{LIF}$ used for the derivation processing are stored in the storage unit 17.

<During-Startup Condition Determination Processing>

Next, the aforementioned during-startup condition determination processing performed in step S5 shown in FIG. 8 will be described. This during-startup condition determination processing, which is performed irrespective of the remaining amount of charge in the battery 1, is based on the premise that the reference-discharge-characteristic derivation processing in step S6 has been completed.

In this during-startup condition determination processing, as described above, the lower limit voltage value for the time when the during-engine-startup load $L_S$ is connected to the battery 1 is measured as the used lower limit voltage $V_{LR}$ via the voltage sensor 13, and then the degree of deterioration of the battery 1 and the remaining amount of charge therein at that point in time are determined based on the used lower limit voltage value $V_{LR}$, based on the used no-load voltage value $V_{OR}$ which is the no-load voltage measured in the next previous step S2, and based on the information obtained through the reference-discharge-characteristic derivation processing in step S6 and stored in the storage unit 17.

First, the processing for determining the degree of deterioration will be described. As a first step, the no-load voltage value for which corresponding lower limit voltage value on the curve G1 in the graph of FIG. 6, represented by the relational expressions (4) and (5) stored in the storage unit 17, is equal to the used lower limit voltage value $V_{LR}$ is derived as the corresponding reference no-load voltage value $V_{OS}$. Or, the value of the variable $V_{OI}$ obtained by assigning the used lower limit voltage value $V_{LR}$ to the variable $V_{L1}$ in equations (4) and (5) is derived as the corresponding reference no-load voltage value $V_{OS}$.

Subsequently, the first differential value D11 which is a difference between the initial reference no-load voltage value $V_{OIF}$ stored in the storage unit 17 and its corresponding reference no-load voltage value $V_{OS}$ is compared with the second differential value D12 which is a difference between the initial reference no-load voltage value $V_{OIF}$ and the used no-load voltage value $V_{OR}$, thereby to detect the degree of deterioration of the battery 1 at that point in time. For example, the degree of deterioration of the battery 1 is detected based on the ratio (corresponding to the hatched area C1 in FIG. 6) of the second differential value D12 to the first differential value D11.

Next, the processing for determining the remaining amount of charge will be described. This determination processing is performed using the used lower limit voltage value $V_{LR}$ and the corresponding reference no-load voltage value $V_{OS}$ obtained during the processing for determining the degree of deterioration.

Subsequently, the minimum after-actuation no-load voltage value $V_{ORE}$, which is a no-load voltage obtained on the assumption that the remaining amount of charge in the battery 1 at that point in time would be zero, is derived as follows. Specifically, the ratio between the value D13 obtained by subtracting the minimum reference no-load voltage value $V_{OIE}$ stored by initial setting in the storage unit 17 from the previously obtained initial reference no-load voltage value $V_{OIF}$ and the value D14 obtained by subtracting the minimum used no-load voltage value $V_{ORE}$ from the initial reference no-load voltage value $V_{OIF}$ is made equal to the ratio between the value D11 obtained by subtracting the corresponding reference no-load voltage value $V_{OS}$ from the initial reference no-load voltage value $V_{OIF}$ and the value D12 obtained by subtracting the used no-load voltage value $V_{OR}$ from the initial reference no-load voltage value $V_{OIF}$, thereby to derive the minimum used no-load voltage value $V_{ORE}$.

Then, the third differential value D21 which is a difference between the initial reference no-load voltage value $V_{OIF}$ and the minimum used no-load voltage value $V_{ORE}$, and the fourth differential value D22 which is a difference between the used no-load voltage value $V_{OR}$ and the minimum used no-load voltage value $V_{ORE}$ are compared to detect the remaining amount of charge in the battery 1 at that point in time. For example, the remaining amount of charge in the battery 1 is detected based on the ratio of the second differential value D22 to the third differential value D21 (corresponding to the hatched area C2 in FIG. 6).

<Summary>

As so far described, according to the preferred embodiment of the present invention, the rate of change in the internal resistance of a brand-new battery 1 with changes in the no-load voltage in response to changes in the remaining amount of charge in the battery 1 is almost common to batteries 1 of different grades or the like. Accordingly, based on the rate of change in the internal resistance and based on the voltage-drop characteristic of a fully-charged battery 1 with respect to the vehicle-unique during-engine-startup load $L_S$ for example at the completion of vehicle assembly, the vehicle-unique discharge characteristic of the battery 1 being in a brand-new condition which is used as a criterion for evaluating the condition of the battery 1, can automatically be acquired without setting a unique parameter for each battery and for each vehicle. This reduces labor and equipment costs for parameter setting and makes it easy to respond to variations due to individual differences among the same model of vehicles.

As described above, the degree of deterioration and the remaining amount of charge are evaluated based on the reference discharge characteristic of the battery 1 and the discharge characteristic of the battery 1 during discharge upon engine startup at each evaluation time. This allows accurate detection of the degree of deterioration of the battery 1 and the remaining amount of charge therein through a simple computation without taking special measures such as parameter setting against different models or individual differences among vehicles.

Further, the degree of deterioration of the battery 1 at each point in time can be detected without depending on the remaining amount of charge in the battery 1. In the same way, the remaining amount of charge in the battery 1 at each point in time can be detected without depending on the degree of deterioration of the battery 1.

According to the preferred embodiment of the present invention, the minimum value of the output voltage of the battery 1 during discharge upon engine startup is utilized as the on-load voltage value of the battery 1. This facilitates and ensures the acquisition of the on-load voltage value which effectively represents the characteristic of the battery 1; eliminates the need for the battery 1 to be discharged specially for evaluation of the condition of the battery 1; and allows accurate evaluation of the capability of the battery 1 for starting the engine. As an alternative in this respect, not the discharge of the battery 1 upon engine startup but discharge caused by any other load may be utilized to detect the discharge characteristic of the battery 1. Further while the minimum value of the output voltage of the battery 1 during discharge is used as the on-load voltage value, for example an output voltage value obtained after a lapse of a predetermined very short time from the start of discharge may be used as the on-load voltage value.

Since a fully charged condition is used as a criterion for determining the remaining amount of charge in a brand-new battery 1 for obtaining the discharge characteristic of the battery 1, the remaining amount of charge in the battery 1 can be set to a reference condition with ease and accuracy. This consequently allows easy and accurate detection of the discharge characteristic of the battery 1. In this regard, any other level of the remaining amount of charge may be used as a criterion for obtaining the discharge characteristic of a brand-new battery 1.

Since information about the rate of change in the internal resistance of the battery 1 with respect to change in the no-load voltage is obtained by discharge test in which a constant current is discharged (for example, discharge test in conformity with the JIS standards for battery capacity tests), it is possible to obtain information that is suitable for derivation of the discharge characteristic of the battery 1 during engine startup.

The reliability of the technique for evaluating the condition of the battery 1 according to the aforementioned preferred embodiment tends to decrease with increasing lower limit voltage value $V_{LR}$ of the battery 1 at each evaluation time. Thus, to ensure the reliability of the evaluation results, the degree of deterioration of the battery 1 and the remaining amount of charge therein may be determined only when the lower limit voltage value $V_{LR}$ is at or below a predetermined reference level.

The device configuration in FIG. 7 according to the aforementioned preferred embodiment may be provided additionally with a temperature sensor for measuring the temperature of the battery 1, thereby to evaluate the condition in consideration of the temperature of the battery 1. More specifically, there is for example a method for deriving two-dimensional coordinate information (which may also be called three-dimensional coordinate information when the temperature is taken into account) that represents the relationship between no-load voltage and lower limit voltage of a brand-new battery 1 at each temperature, and then evaluating the condition at that temperature based on that information; or a method for correcting temperature-dependent parameter values (such as no-load voltage and lower limit voltage) based on temperature (for example, correcting the parameters to their values at standard temperature) for evaluation of the condition.

While the invention has been shown and described in detail, the foregoing description is in all aspects illustrative and not restrictive. It is therefore understood that numerous modifications and variations can be devised without departing from the scope of the invention.

The invention claimed is:

1. A battery condition monitor for storing an initial condition defined by a combination of a battery mounted on a vehicle and said vehicle and comparing the initial condition and a condition during use, using a voltage of said battery which is ever changing before startup and an approximate minimum voltage thereof which is ever changing during startup, thereby to monitor the remaining capacity and the state of deterioration of said battery, said battery condition monitor comprising:

detection means for detecting an output voltage of said battery;

first storage means for storing first information indicating the relationship between change in a no-load voltage value and change in an internal resistance value for said battery being in a nearly brand-new condition;

processing means for, based on said first information stored in said first storage means, based on an initial reference no-load voltage value which is a no-load voltage value detected by said detection means for said battery being in a nearly brand-new and nearly fully-charged condition, and based on an initial reference on-load voltage value which is an output voltage value detected by said detection means when said battery being in a nearly brand-new and nearly fully-charged condition is connected to a predetermined load to be discharged, deriving a reference discharge characteristic of said battery that indicates the relationship between change in said no-load voltage value and change in an on-load voltage value which is an output voltage value detected upon discharge of said predetermined load; and second storage means for storing second information including said initial reference no-load voltage value and said initial reference on-load voltage value, wherein the derivation of said reference discharge characteristic becomes possible without setting a unique parameter for said battery and for each vehicle.

2. The battery condition monitor according to claim 1, wherein if the no-load voltage of said battery is defined as $V_{OI}$, the on-load voltage of said battery as $V_{LI}$, said initial reference no-load voltage value as $V_{OIF}$, said initial reference on-load voltage value as $V_{LIF}$, an internal resistance of said battery as $R_{BI}$, and the internal resistance value of said battery being in a nearly brand-new and nearly fully-charged condition as $R_{BIF}$, said first information given as a function $f(V_{OI}) = R_{BI}/R_{BIF}$, and said reference discharge characteristic is expressed as:

$$V_{LI} = [V_{LK}/\{(V_{OI} - V_{LK}) \cdot f(V_{OI}) + V_{LK}\}] \cdot V_{OI} \text{ where}$$

$$V_{LK} = (V_{LIF}/V_{OIF}) \cdot V_{OI}.$$

3. The battery condition monitor according to claim 1, wherein said processing means derives the degree of deterioration of said battery and the remaining amount of charge therein based on said reference discharge characteristic, based on an used no-load voltage value which is a no-load voltage value detected by said detection means for said battery which has started to be used, and based on an used on-load voltage value which is an output voltage value detected by said detection means for the time when said battery which has started to be used is connected to said predetermined load to be discharged.

4. The battery condition monitor according to claim 3, wherein
said processing means determines said degree of deterioration based on a difference between said initial reference no-load voltage value and a corresponding no-load voltage value which is a no-load voltage value corresponding to said used on-load voltage value in said reference discharge characteristic, and based on a difference between said initial reference no-load voltage value and said used on-load voltage value.

5. The battery condition monitor according to claim 3, wherein said processing means determines:
a first ratio of a difference between said initial reference no-load voltage value and said used on-load voltage value to a difference between said initial reference no-load voltage value and a corresponding no-load voltage value which is a no-load voltage value corresponding to said used on-load voltage value in said reference discharge characteristic, and
a minimum used no-load voltage value which is a no-load voltage value for the time when the remaining amount of charge in said battery which has started to be used is approximately zero, so that said first ratio becomes equal to a second ratio of a difference between said initial reference no-load voltage value and said minimum used no-load voltage value to a difference between said initial reference no-load voltage value and a minimum reference no-load voltage value which is a no-load voltage value for the time when the remaining amount of charge in said battery being in a nearly brand-new condition is approximately zero,
wherein said remaining amount of charge is determined based on the difference between said initial reference no-load voltage value and said minimum used no-load voltage value and based on a difference between said used no-load voltage value and said minimum used no-load voltage value.

6. The battery condition monitor according to claim 2, wherein
said processing means derives the degree of deterioration of said battery and the remaining amount of charge therein based on said reference discharge characteristic, based on an used no-load voltage value which is a no-load voltage value detected by said detection means for said battery which has started to be used, and based on an used on-load voltage value which is an output voltage value detected by said detection means for the time when said battery which has started to be used is connected to said predetermined load to be discharged.

7. The battery condition monitor according to claim 6, wherein
said processing means determines said degree of deterioration based on a difference between said initial reference no-load voltage value and a corresponding no-load voltage value which is a no-load voltage value corresponding to said used on-load voltage value in said reference discharge characteristic, and based on a difference between said initial reference no-load voltage value and said used on-load voltage value.

8. The battery condition monitor according to claim 6, wherein
said processing means determines:
a first ratio of a difference between said initial reference no-load voltage value and said used on-load voltage value to a difference between said initial reference no-load voltage value and a corresponding no-load voltage value which is a no-load voltage value corresponding to said used on-load voltage value in said reference discharge characteristic, and
a minimum used no-load voltage value which is a no-load voltage value for the time when the remaining amount of charge in said battery which has started to be used is approximately zero, so that said first ratio becomes equal to a second ratio of a difference between said initial reference no-load voltage value and said minimum used no-load voltage value to a difference between said initial reference no-load voltage value and a minimum reference no-load voltage value which is a no-load voltage value for the time when the remaining amount of charge in said battery being in a nearly brand-new condition is approximately zero,
wherein said remaining amount of charge is determined based on the difference between said initial reference no-load voltage value and said minimum used no-load voltage value and based on a difference between said used no-load voltage value and said minimum used no-load voltage value.

* * * * *